US006311305B1

United States Patent

(12) United States Patent
Sollish et al.
(10) Patent No.: US 6,311,305 B1
(45) Date of Patent: *Oct. 30, 2001

(54) METHOD AND SYSTEM FOR OVERRIDING ERROR CORRECTION

(75) Inventors: Baruch Sollish, Emmanuel (IL); Dennis Howe, Tucson, AZ (US)

(73) Assignee: T.T.R. Technologies Ltd., Kfar Saba (IL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/032,905

(22) Filed: Mar. 2, 1998

Related U.S. Application Data

(60) Provisional application No. 60/038,080, filed on Mar. 6, 1997.

(51) Int. Cl.[7] .................................................... H03M 13/00

(52) U.S. Cl. .............................. 714/784; 714/756; 380/4; 341/106; 341/58; 341/59; 360/40

(58) Field of Search ..................................... 714/787, 756, 714/784, 719, 758, 776, 44, 710; 395/180; 380/4, 49; 341/69, 144, 106; 369/53.23, 53.22, 112.24, 44.27, 44.29, 44.13, 116, 47.11, 47.22, 59.21, 124.09, 275.3, 47.15, 59.25, 59.26; 385/7, 16, 40; 358/518, 520, 521, 524; 359/136; 345/431; 370/358; 348/641, 725; 386/126, 45; 375/346; 360/40, 15, 48, 53

(56) References Cited

U.S. PATENT DOCUMENTS 4,823,210 * 4/1989 Bond ...................................... 360/60
5,504,728 * 4/1996 Yokota et al. ........................... 69/58
5,699,434 * 12/1997 Hogan .................................... 705/57
5,768,286 * 6/1998 Hsu et al. ............................ 714/719
5,809,006 * 9/1998 Davis et al. ...................... 369/275.4
5,828,754 * 10/1998 Hogan .................................... 341/69
5,838,695 * 11/1998 Yang .................................... 714/756
5,841,749 * 11/1998 Sako ...................................... 369/59

* cited by examiner

*Primary Examiner*—Albert Decady
*Assistant Examiner*—Guy Lamarre
(74) *Attorney, Agent, or Firm*—Darby & Darby

(57) ABSTRACT

A method and system for overriding error correction capabilities of digital optical media is provided. The overriding of the error correction codes (ECC) is accomplished by causing a non-correctable pattern of erroneous symbols to occur in the ECC codeword. Specific redundancy symbols are replaced with invalid symbols. The non-correctable error pattern is recognized by the ECC decoder as being non-correctable and the ECC decoder does not attempt to change the values of any symbols of an ECC codeword that is contaminated by the detectable non-correctable error pattern.

28 Claims, 9 Drawing Sheets

R1 — 0000000001000
R2 — 0000000001001
0000000010000
0000000010001
0001000000000
0001000000000
0100100000000 — R7
1000100000000
R9 — 1001000000000

| BYTE VALUE | CHANNEL BIT EFM CODE |
|---|---|
| 00 | 01001000100000 |
| 01 | 10000100000000 |
| 02 | 10010000100000 |
| 03 | 10001000100000 |
| 04 | 01000100000000 |
| 05 | 00000100010000 |
| 06 | 00010000100000 |
| 07 | 00100100000000 |

26 28

| DATA GROUP *n* | DIGITAL OPTICAL MEDIA TRACK | |
|---|---|---|
| BYTE NUMBER | FRAME NUMBER | SYMBOL NUMBER |
| 0 | *n* + 3 | 1 |
| 1 | *n* + 6 | 2 |
| 2 | *n* + 27 | 7 |
| 3 | *n* + 30 | 8 |
| 4 | *n* + 65 | 17 |
| 5 | *n* + 68 | 18 |
| 6 | *n* + 89 | 23 |
| 7 | *n* + 92 | 24 |
| 8 | *n* + 11 | 3 |
| 9 | *n* + 14 | 4 |
| 10 | *n* + 35 | 9 |
| 11 | *n* + 38 | 10 |
| 12 | *n* + 73 | 19 |
| 13 | *n* + 76 | 20 |
| 14 | *n* + 97 | 25 |
| 15 | *n* + 100 | 26 |
| 16 | *n* + 19 | 5 |
| 17 | *n* + 22 | 6 |
| 18 | *n* + 43 | 11 |
| 19 | *n* + 46 | 12 |
| 20 | *n* + 81 | 21 |
| 21 | *n* + 84 | 22 |
| 22 | *n* + 105 | 27 |
| 23 | *n* + 108 | 28 |

| | |
|---|---|
| $R_1$ | 00000000001000 |
| $R_2$ | 00000000001001 |
| | 00000000010000 |
| | 00000000010001 |
| | 00001000000000 |
| | 00010000000000 |
| $R_7$ | 01001000000000 |
| | 10001000000000 |
| $R_9$ | 10010000000000 |

| C2 Byte, and Symbol Number (132) | C2 Symbol Number and Frame Number (134) | Symbol Numbers 29, 31 in Frame (136) | Symbol Numbers 30, 32 in Frame (138) |
|---|---|---|---|
| $C2_0$ | $n + 49$, 13 | $n + 49$ | $n + 48$ |
| $C2_1$ | $n + 52$, 14 | $n + 53$ | $n + 52$ |
| $C2_2$ | $n + 57$, 15 | $n + 57$ | $n + 56$ |
| $C2_3$ | $n + 60$, 16 | $n + 61$ | $n + 60$ |

120 122 124 126 128

| *n*th 24-byte sector sub-block Data Byte to be made Ambiguous | Symbol to be made Ambiguous | | C1 Error-Correction Symbols to be made invalid | |
|---|---|---|---|---|
| | Frame | Symbol Number | Symbol Numbers 29, 31 in Frame | Symbol Numbers 30, 32 in Frame |
| 0 | *n* + 1 | 1 | *n* + 1 | *n* |
| 1 | *n* + 4 | 2 | *n* + 5 | *n* + 4 |
| 2 | *n* + 25 | 7 | *n* + 25 | *n* + 24 |
| 3 | *n* + 28 | 8 | *n* + 29 | *n* + 28 |
| 4 | *n* + 65 | 17 | *n* + 65 | *n* + 64 |
| 5 | *n* + 68 | 18 | *n* + 69 | *n* + 68 |
| 6 | *n* + 89 | 23 | *n* + 89 | *n* + 88 |
| 7 | *n* + 92 | 24 | *n* + 93 | *n* + 92 |
| 8 | *n* + 9 | 3 | *n* + 9 | *n* + 8 |
| 9 | *n* + 12 | 4 | *n* + 13 | *n* + 12 |
| 10 | *n* + 33 | 9 | *n* + 33 | *n* + 32 |
| 11 | *n* + 36 | 10 | *n* + 37 | *n* + 36 |
| 12 | *n* + 73 | 19 | *n* + 73 | *n* + 72 |
| 13 | *n* + 76 | 20 | *n* + 77 | *n* + 76 |
| 14 | *n* + 97 | 25 | *n* + 97 | *n* + 96 |
| 15 | *n* + 100 | 26 | *n* + 101 | *n* + 100 |
| 16 | *n* + 17 | 5 | *n* + 17 | *n* + 16 |
| 17 | *n* + 20 | 6 | *n* + 21 | *n* + 20 |
| 18 | *n* + 41 | 11 | *n* + 41 | *n* + 40 |
| 19 | *n* + 44 | 12 | *n* + 45 | *n* + 44 |
| 20 | *n* + 81 | 21 | *n* + 81 | *n* + 80 |
| 21 | *n* + 84 | 22 | *n* + 85 | *n* + 84 |
| 22 | *n* + 105 | 27 | *n* + 105 | *n* + 104 |
| 23 | *n* + 108 | 28 | *n* + 109 | *n* + 108 |

FIG. 10A

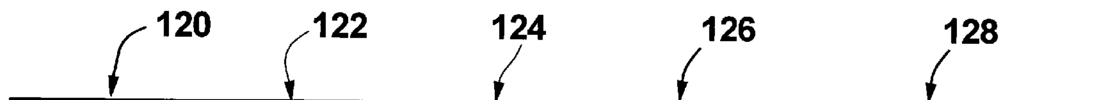

| *n*th 24-byte sector sub-block Data Byte to be made Ambiguous | Symbol to be made Ambiguous | | C1 Error-Correction Symbols to be made invalid | |
|---|---|---|---|---|
| | Frame | Symbol Number | Symbol Numbers 29, 31 in Frame | Symbol Numbers 30, 32 in Frame |
| 0 | *n* + 4 | 2 | *n* + 5 | *n* + 4 |
| 1 | *n* + 1 | 1 | *n* + 1 | *n* |
| 2 | *n* + 28 | 8 | *n* + 29 | *n* + 28 |
| 3 | *n* + 25 | 7 | *n* + 25 | *n* + 24 |
| 4 | *n* + 68 | 18 | *n* + 69 | *n* + 68 |
| 5 | *n* + 65 | 17 | *n* + 65 | *n* + 64 |
| 6 | *n* + 92 | 24 | *n* + 93 | *n* + 92 |
| 7 | *n* + 89 | 23 | *n* + 89 | *n* + 12 |
| 8 | *n* + 12 | 4 | *n* + 13 | *n* + 88 |
| 9 | *n* + 9 | 3 | *n* + 9 | *n* + 8 |
| 10 | *n* + 36 | 10 | *n* + 37 | *n* + 36 |
| 11 | *n* + 33 | 9 | *n* + 33 | *n* + 32 |
| 12 | *n* + 76 | 20 | *n* + 77 | *n* + 76 |
| 13 | *n* + 73 | 19 | *n* + 73 | *n* + 72 |
| 14 | *n* + 100 | 26 | *n* + 101 | *n* + 100 |
| 15 | *n* + 97 | 25 | *n* + 97 | *n* + 96 |
| 16 | *n* + 20 | 6 | *n* + 21 | *n* + 20 |
| 17 | *n* + 17 | 5 | *n* + 17 | *n* + 16 |
| 18 | *n* + 44 | 12 | *n* + 45 | *n* + 44 |
| 19 | *n* + 41 | 11 | *n* + 41 | *n* + 40 |
| 20 | *n* + 84 | 22 | *n* + 85 | *n* + 84 |
| 21 | *n* + 81 | 21 | *n* + 81 | *n* + 80 |
| 22 | *n* + 108 | 28 | *n* + 109 | *n* + 108 |
| 23 | *n* + 105 | 27 | *n* + 105 | *n* + 104 |

FIG. 10B

LASER
166
LASER WRITING CONTROL
164

152
150
170
MUX
168
162
160
DATA
ENCODER
TIMING AND CONTROL
INVALID & AMBIGUOUS SYMBOL GENERATOR
174
172

METHOD AND SYSTEM FOR OVERRIDING ERROR CORRECTION

This patent application claims the priority of U.S. provisional patent application No. 06/038,080, filed Mar. 6, 1997, which is incorporated herein by reference.

FIELD AND BACKGROUND OF THE INVENTION

The present invention relates to the disabling of error-correction on digital optical media, such as Compact Disc (CD), Compact Disc Read_only Memory (CD-ROM) and Digital Video Disc (DVD).

Digital optical media is well-known in the art and is utilized to store large amounts of digital data in digital form, such as audio data, video data, software data, or document data. Software and document data may be read and utilized by a computer from digital optical media, such as Compact Disc Read-Only Memory (CD-ROM). There are also widely-available players for reading data from digital optical media and using this data to reconstruct audio, visual, text, and audio-visual information. Such players include, but are not limited to, CD players, CD-ROM multi-media players, game-playing systems, and DVD-players, which can reproduce sound, images, and test from data stored on digital optical media. Some computers are also configured to duplicate the functionality of CD players, CD-ROM multi-media players, game-playing systems, and DVD-players.

Description of Prior Art Digital Optical Media

Digital optical media technology is established according to a series of international standards, all of which are incorporated herein by reference. For example, some common standards applicable to CD's include: the International Standards Organization (ISO) standard 9660 entitled "Information Processing—Volume and File Structure of CD-ROM for Information Interchange, ISO standard 13490-I", the International Electrotechnique Commission (CEI-IEC) standard 908, also known as the "Red Book", and ISO/IEC 10140, also known as the "Yellow Book".

FIG. 1 is a cross-sectional schematic of a portion of the data surface of a digital optical medium. Referring briefly to FIG. 1, according to these standards, digital optical media has at least one layer of transparent refractive material 10 which has data recorded on one surface which is coated with a reflective material 12, and covered with an optional protective layer 14. Reflective material 12, in combination with transparent refractive material 10, produces transparent reflective layer 24 whose optical properties depend on the properties both of reflective material 12 and transparent refractive material 10.

Reading Data from Digital Optical Media

In order to read the data written onto Digital Optical media, such as CD-ROM and DVD, the media is rotated at a precisely-controlled speed, and light from a laser is focused through the disc-shaped substrate into transparent reflective layer 24 from which it is reflected back to a detector which measures the intensity of the reflected light. During the recording or manufacturing process of the digital optical media, the optical properties of the layer 24 are physically modified according to the data to be recorded so that the reflected light will vary significantly in intensity depending on where the laser light strikes. Typically, there are two different intensity levels for the reflected light. A region 18 which reflects a high intensity of the laser light is referred to as "land", and a region 20 which reflects a low intensity of light is referred to as "pit". Pits and lands may be physically implemented in different ways, but they always have the property of reflecting discernibly different light intensities. Moreover, pits and lands have sharp, well-defined boundaries 22, so that it is possible to precisely identify the location where a pit ends and a land begins and where a land ends and a pit begins. The boundary 22 between one region and another is known as a "transition".

Data is recorded on to Digital Optical Media in a spiral track along which these patterns of pits and lands are laid out in a linear fashion. As the media spins, the laser light sweeps along the track and whenever the intensity of the reflected light changes from one value to another, i.e. when the incident light passes either from land to pit or from pit to land, the detector circuitry signals that a transition has occurred. It is not the intensity of the reflected light, but rather the precise timing of these transitions from one intensity to the other (relative to a data clock maintained within the digital data detector of the medium reader) which represents the digital data recorded on the media.

Data Representation

Digital data is represented within a computer or optical media player as a series of "bits" (binary digits, i.e., 1's and 0's), where 8 bits are typically grouped into a data unit referred to as a "byte". In general, the sequence of bits is unconstrained in the sense that any specific bit can be succeeded by a 1 or a 0. It is not desired, however, to record unconstrained data on digital optical media using the recording technique previously described (i.e., if pits represent 1's and lands represent 0's or if a transition occurs only when a 1is recorded), because transitions may then occur too frequently or not frequently enough, depending on the data. For example, a long sequence of 1's or a long sequence of 0's would result in a very long space between transitions, and this would cause the data decoder clock to lose synchronization with the data recorded on the track. Moreover, on extremely long runs of 1's or 0's would cause a very long space to occur between successive pits in the in-track direction, this could interfere with the ability of the playback spot to follow such a track. A series of alternating 1's and 0's on the other hand would result in a very short space between transitions and would require the disc reader to have an extremely small focused spot size. To avoid these problems, therefore, prior to recording,. every byte of data is instead encoded to convert it to a constrained binary sequence that exhibits at least a desired minimum number of 0's, but not more than a desired maximum number of 0's, between any two 1's.

For example, on a CD, data bytes are converted to a 14-bit constrained sequence using a mapping known as the Eight-to-Fourteen-Modulation (EFM) code, as is partially illustrated by way of example in the table of FIG. 2, to which reference is now briefly made. The table of FIG. 2 comprises two columns, referenced 26 and 28, which list the byte values and the corresponding channel bit EFM codes, respectively. Each 14-bit EFM code sequence observes strict limits in the spacing of the transitions along the digital optical media data track. In the EFM code sequences, transitions are indicated by 1's and no variation of the media track feature (i.e., pit or land) is indicated by 0's, but only certain patterns are used. Valid EFM code sequences have the property that transitions occur no closer than three (3) length units from one another, and no further than eleven (11) length units from another. The value of a length unit which corresponds to a single EFM code bit, may vary from one embodiment to another, but in CD digital optical media it is nominally on the order of 0.3 micrometers. There are 256 different valid EFM codes which have been arbitrarily assigned to represent the 256 different byte patterns, and it is the EFM code sequences which are actually recorded on the digital optical media data track. The individual bits of these code sequences are referred to as "channel bits" of the recorded data, of which EFM encoding is but one embodiment of channel coding.

Referring briefly to FIG. 3 which is a schematic illustration of digital signals, the player detects transitions and indicates them by a pulse 30 in time, and it indicates an absence of transition by a constant signal value 32. This pulse signal can be obtained by taking a rectified derivative of signal 34 which is output by the disc player as its focused read spot scans the data track segment formed by pits 20 (FIG. 1). When the signal is plotted as an ordinate 38 against a time abscissa divided into suitable time units 36, which correspond to the scanning of a single length unit (channel bit) along the optical media track. The positions of the transitions 30 indicate the channel bit 1's, and the constant signal positions indicate the channel bit 0's. In the example of FIG. 3, the detected 14-bit EFM code sequence 10001000100000. Referring to the table in FIG. 2 shows that the byte encoded by the particular channel bit sequence has a byte value 03.

To further insure that the minimum and maximum length limits that separate transitions are strictly observed, successive 14-bit EFM code sequences are joined by special 3-bit groups known as "merge bits" which contain no information, but are able to produce a transition if needed to maintain the transition spacing constraints. The use of such encoding as EFM places reasonable bounds on the frequency spectrum of the playback signal regardless of the data recorded along the track and enables digital data to be read from the media with sufficient accuracy. When the player reads the digital optical media track, the timing of the channel bit transitions is measured relative to the period of the data detectors internal clock to determine which code sequence is present, and this is then translated by a look-up table into the corresponding data byte value.

Physically, the channel bits are represented in the digital optical media as regions of pits alternating with regions of lands, such that the regions have well-defined sizes in the in-track direction which are integer multiples of a size corresponding to the length unit, a channel bit. For CD, the minimum size of a region is three times this size, while the maximum size (0.9 mm) of a region is eleven (11) times this size (3.3 mm).

Frames

In CD recording, EFM encoded symbols (byte values are referred to as symbols) are used to build groups of special data units called "frames", through which higher-level data organization and coordination is achieved. By way of example, FIG. 4, to which reference is now briefly made, illustrates a frame for a CD.

The CD frame begins with a synchronization header 40, which is a special sequence of transitions used by the player to detect the beginning of the frame, to calibrate its timing, and to adjust the rotational speed of the media. Following the header is a special control symbol 41, which is followed by 12 data symbols 42, four error correction symbols 44, 12 more data symbols 46, and another four error correction symbols 48, for a total of 33 symbols. Each EFM encoded symbol 43 comprises 14 channel bits, and adjacent symbols are separated by a pattern of 3 merge bits 45. A group of a specified number of successive frame is referred to as a "section". On a CD, for example, 98 contiguously recorded frames constitute a section. Sections recorded on CD digital optical media track are assigned unique numbers, and it is thus possible to make unequivocal reference to any individual control and display section on the data track. The location of any individual symbol of a CD-ROM data sector within the data track, relative to the start of a specific control and display section, can be determined of one knows the offset between the start of a control and display section and the first logical byte of a CD-ROM sector.

Error Correction

Transitions are physically represented by microscopic patterns of pits and lands, and excessive physical damage to the media surface, such as a scratch, can obscure the precise location of the region boundaries and thereby corrupt the data reading. To protect against such hazards, the media is written with additional, redundant data in the form of error correcting symbols, also known as "redundancy symbols". These are mathematically determined to correspond to the other data written on the media in such a way that the player can use them as it reads the media not only to determine if errors have occurred, but under certain conditions to correct errors. A fixed number of data symbols, together with fixed number of redundancy symbols compacted for them form a data structure known as an error correction codeword. Methods for choosing and implementing appropriate error correction coding are well-known in the art. The error correction code (ECC) employed in the CD system is referred to as the "Cross-Interleave Reed-Solomon Code" (CIRC).

In ordinary use, error detection and correction is desirable, as it reduces the probability that the data read from digital optical media and delivered to the user will becomes corrupted by minor physical damage to the media.

Data Interleaving

Symbols occurring sequentially on the data track of digital optical media do not correspond to sequential bytes in the input stream of user data. Rather, each byte of sequential data is assigned a non-sequential location within a specific frame when its corresponding symbol is written onto the disk. This is known as "interleaving", and is schematically illustrated in FIG. 5, to which reference is now briefly made. A series of sequential data bytes 50 divided into groups 52 of 24 bytes is mapped into a corresponding series of symbols which are sequentially recorded on the data track of the CD. As previously mentioned, data sequentially recorded on the data track in sequentially divided into frames 56. A particular data byte 58 is mapped to a symbol in a specific location in a specific frame 60, and the next byte 62 within the same group is mapped to a symbol in a much later frame 64. This process is repeated so that the next sequential byte 66 is mapped to an even later frame 68. In a similar way, previous data byte 70 has been mapped to frame location 72 in the space between later consecutive byte 58 and 62. The precise mapping for CD's is illustrated in the table in FIG. 6.

The purpose of interleaving is to spread out the physical locations of the sequential input data over the media so that localized damage to the media surface will not grossly impact any one segment of the data. Instead, the effect of the damage will be distributed over a large data segment. In particular, the interleaving is chosen to sufficiently insure that reasonable levels of digital storage medium imperfection damage will cause contamination of only a few constituent symbols of an ECC codeword. This will insure that the position of the erroneous symbols in the codeword can be located and that then correct values can be calculated when the ECC codeword is decoded in such a way that only small number of erroneously recovered data symbols (i.e., errors) will occur in any one contiguous segment of the data.

The input bytes of data to be recorded on a CD are considered to be in groups of 24. The size of this group corresponds to the number of input data symbols within a frame on the media data track. FIG. 6, to which reference is now briefly made, illustrates precisely how sequential bytes of data in 24-byte group n (column 74) are mapped to non-sequential frames (column 76) and symbol locations (column 78) within those frames on a CD data track. It may be noted from FIG. 6 that no data is mapped to frame symbol number 0, since this location is where the control symbol is placed. Furthermore, no data is mapped to frame symbol numbers 13, 14, 15 and 16, not to frame symbol numbers 29, 30, 31, and 32, since these locations are sued for the error-correcting redundancy symbols.

Reading and Error Correcting

As the optical media player reads the EFM channel sequences corresponding to each symbol from the digital optical media, it checks them to make sure that they are valid. For example, if a CD layer encounters a channel sequence with two transitions less than 3 or more than 11 time units apart, it flags that symbol as invalid, since the channel bit sequences used in CD are the EFM code sequences and no valid EFM code sequence has such transitions. An error of this sort is referred to as a "run length limited" (RLL) error, and an invalid symbol thus flagged is referred to as an "erasure". Under normal circumstances an RLL error implies that the media has been damaged in such a way that the transition timing cannot be read properly. In certain conditions, erasures may be corrected by the ECC decoder.

It is also possible that a symbol might have been damaged, but in such a way that it corresponds to a valid channel bit sequence. To guard against such errors, the ECC decoder checks every recovered ECC codeword to determine if any of its constituent symbols have been read erroneously. In certain conditions, such errors may also be corrected by the ECC decoder.

The Phases of Data Re-ordering and Error Correction

During the reading operation, the player re-orders the data symbols contained in the sequentially recovered frames recorded on the media into their correct sequence. For CD digital optical media there are two separate phases of the data reordering, and at each phase a different set of error correcting code words are formed and checked (by the ECC decoder) for errors. Other embodiments may employ additional phases. This is schematically illustrated for CD's in FIG. 7, reference to which is now briefly made. The decoded channel bit symbols 80 corresponding to the last 32 symbols of each recovered frame pass through a partial de-interleaving step 82, comprising a number of delays for selected symbol positions. Then "C1", the first level of error correction 84 is applied to the resulting 32-symbol C1 ECC codeword. This is followed by a further partial de-interleaving step 86, after which "C2", the second level of error correction 88 is applied to the resulting 28-symbol C2 codeword. The final de-interleaving step 90 results in the data bytes 92 being reassembled into their original input sequence order with the two levels of error correction having been applied in the process. (The four C1 code redundancy symbols and the four C2 redundancy symbols are discarded after C1 and C2 decoding, respectively.)

In the first level 84 the C1 decoder may be able to correct errors not only in the 24 data symbols, but also errors in the four C2 redundancy symbols that comprise the C1 codeword. Each of the 24 data symbols in a particular C1 codeword was originally contained in one of 24 different input data frames. Each of the four C2 redundancy symbols belong to one of four different C2 codewords; all four C1 redundancy symbols below to the particular C1 codeword. The C2 codeword obtained in the second level error correction comprises 24 input data symbols taken from only two input data frames and the four C2 parity symbols all belong to the particular C2 codeword.

Each level of the CIRC error-correcting decoding is able to detect the existence of erroneous symbols in a specific codeword, and within any such codeword may correct up to two erroneous symbols whose locations within the codeword are unknown. Error locations are normally unknown when the erroneous symbols were obtained from valid EFM code sequences, for such errors are not immediately recognizable by the EFM decoding process as such. If, on the other hand, the locations of erroneous symbols are known, the CIRC method may correct up to four erroneous symbols. Error locations are normally known when the errors correspond to invalid EFM code sequences which were previously marks by the EFM decoder as erasures. Thus, each phase of error correction may correct up to $t_e$ valid symbols which are erroneous, and up to $t_x$ erasures, such that $t_e$ and $t_x$ jointly satisfy the inequality $2t_e+t_x<5$. Each phase of error correction may thus also correct one valid symbol which is erroneous and two erasures. Errors in excess of these limits will be detected with finite probability, but the player will not be able to correct them. We note that the probability of detecting that an ECC code word contains an non-correctable number of errors decreases as the number of errors in the codeword increases.

If the decoder fails to detect that a non-correctable number of errors has contaminated a specific codeword, it will deliver (at its option) a valid codeword that is different from the original (contaminated) codeword. This output codeword will, in general, have symbol values in several codeword locations that are different from the those in either the original uncontaminated codeword or the contaminated original codeword.

Thus, the player recorders the data from the symbols recorded on the digital optical media track and while so doing, it attempts to detect errors and to correct them in two related, but distinct, phases. In this manner, under normal conditions a player will be able to recover virtually error-free all the data from digital optical media which has been subjected to ordinary care in handling.

There are, however, occasions when it is useful to override such error and/or erasure correction capabilities in a player of the media. For example, when performing quality control tests on digital optical media, it is necessary to have a means of evaluating the intrinsic uncorrected error rates inherent in the media; this measurement cannot be performed directly if the player uses error-correcting methods to remove the errors. Another example is in evaluating the efficiency of digital optical media decoding mechanisms.

In a co-pending U.S. patent application Ser. No. 08/689,209, filed Aug. 5, 1996 and owned by the common applicants of the present invention, applicants describe the writing of "invalid" codes onto any digital optical media by not following the standards for writing data. For example, one can create pits and lands which are shorter than three channel bits or longer than eleven channel bits. Alternatively, the transition between pits and lands can be smooth, rather than sharp as required by the standards, or the transitions can be located so as not to be synchronized with a channel data detector clock signal.

Invalid EFM code sequences can be used to mark digital optical media with identifying data. The erroneous data symbols obtained from invalid EFM code sequences can also be used as a key for protecting software by performing certain operations to ascertain that the marked optical media has markings specific to (e.g., at certain data track locations) the protected software, before the protected software product can run. The key can also function as the encryption and/or decryption key if the data, or a software program, has been encrypted. However, in order for these bytes that comprise the key to be "seen" by copy-protection software, they must be processed by the ECC decoder(s). If the ECC decoder(s) consistently change the byte values that comprise the key (i.e., the byte values that correspond to the invalid EFM code sequences, to the specific correct values prescribed by the ECC codeword), the key will be hidden from the copy-protection software.

SUMMARY OF THE INVENTION

The applicants have realized that it is possible to record special patterns on to digital optical media in precise locations in such a way that the error-correcting mechanism for a specific symbol will be overridden.

The applicants have further realized that the mathematical principles of the Reed-Solomon (CIRC) error-correcting method do not distinguish between an error in the data symbols and an error in the error correcting redundancy symbols themselves. The overriding of the ECC is accomplished by causing a non-correctable pattern of erroneous symbols to occur in the ECC codeword. The non-correctable error pattern is recognized by the ECC decoder as being non-correctable. The ECC decoder will not attempt to change the values of any symbols of an ECC codeword that is contaminated by the detectable non-correctable error pattern.

An example of the utility of disabling error correction is in conjunction with the writing of special patterns on digital optical media, referred to as "signatures", which are used for copy-protection of the data on the media. In order to read the signatures, error correction must be bypassed. In one embodiment of the invention for bypassing error correction in the writing of signatures, the signatures are written in the final sector of the lead-out area of a CD-ROM disk.

In an embodiment for a CD-ROM, an erroneous symbol can be made to occur at a specific location in a selected ECC codeword by causing an altered 14-bit EPM code sequence to be written to the media data track location corresponding to the targeted symbol. Other sequence lengths are applicable to different media, such as DVD. This can be either a valid incorrect EFM codes sequence (i.e., ones that corresponds to one of the 255 values that are different from the correct symbol value), or it can be an invalid EFM code sequence (i.e., one that does not correspond to any of the possible 256 symbol values). Because the EFM channel sequences are altered after ECC encoding is done, the symbols represented by the altered valid/incorrect EFM sequences will constitute unflagged erroneous symbols (errors) in the ECC codeword presented to the decoder; symbols represented by invalid EFM sequences will be detected and flagged by the majority of EFM demodulators found in the installed base of CD readers and thus will constitute erasures in the ECC codeword presented to the ECC decoder. An error pattern that is composed of $t_e$ errors together with $t_x$ erasures is non-correctable if $2t_e+t_x \geqq d_{min}$, where $d_{min}$ is the minimum distance of the ECC ($d_{min}=5$ for both the C1 and C2 ECC employed in the CD system). Most detectable/non-correctable error patterns will satisfy $d_{min} \leqq 2t_e+t_x \leqq d_{min}+1$.

In a further embodiment of the invention, the detected non-correctable error pattern is created in specific, selected ECC codewords, so that the player's ECC decoder will not attempt to alter any data values in the particular ECC codeword, but will pass all symbol values along, uncorrected. Thus, any altered symbol values that are part of a detected non-correctable error pattern will be passed through the ECC decoder.

Furthermore, the overriding of the ECC is applicable to a wide variety of digital optical media, including CD, CD-ROM, and DVD, and it is usable for digital optical media recordings which are both mass-produced by plastic molding apparatus as well as those which are produced in small quantities by individual recorders controlled by desktop computers, workstations, and the like.

The method of the present invention by which correction of erroneous and/or erased symbols recovered from digital optical media by the media reader's ECC decoder is overridden involves several innovations in writing and formatting data to digital optical media. The present method further discloses a class of special patterns to be recorded onto digital optical media, consisting of invalid channel bit sequences written on the digital optical media.

Finally, a system is disclosed for recording invalid symbols, on digital optical media mastering and recording apparatus.

BRIEF DESCRIPTION OF THE DRAWINGS

The invention is herein described, by way of example only, with reference to the accompanying drawings, wherein:

FIG. 10A is a table showing the mapping of data bytes to their corresponding frame locations and certain C1 redundancy symbols on an audio CD;

FIG. 10B is a table showing the mapping of data bytes to their corresponding frame locations and certain C1 redundancy symbols on a CD-ROM;

DETAILED DESCRIPTION OF THE PREFERRED EMBODIMENTS

The present invention describes a method and a system for replacing the error correction codes (ECC) or symbols with "invalid" symbols. These "invalid" symbols protect the ambiguous symbols which are written onto digital optical media, for example, from being "corrected" during the media player's attempt to correct what it assumes is an "error".

The present application utilizes the term "invalid symbol" to refer to any channel data sequence written on digital optical media which does not correspond to a possible symbol value, as determined by the channel data to symbol mapping cited in the standards for the digital optical media.

In a preferred embodiment of the invention, erroneous or erased symbols are substituted written certain, selectable ECC codewords at particular locations to create a non-correctable error pattern (set of symbol values and locations). Though, the digital optical reader of the ECC decoder reading the digital optical media will be able to detect the non-correctable error pattern, it will not attempt to carry out any error correction of the contaminated ECC codeword containing the erroneous and erased symbols. The values of the erroneous and erased symbols will remain unaltered.

In a further preferred embodiment of the invention, the detected non-correctable error pattern comprises errors or erasures principally located in the redundancy bytes of the targeted ECC codewords and further comprises errors or erasures in the input symbols contained in the targeted codewords.

Although the redundancy symbols will not be returned by the digital optical reader to the requesting software application, the latter altered input data byte will be "seen" by the application and thus can be used to cause some specific action to occur.

The description that follows is illustrated by way of example for CD media, but it will be appreciated by persons skilled in the art that the principles herein are applicable to digital optical media in general, and that the present invention is not limited to application for that specific embodiment of digital optical media, but will apply to other embodiments as well, including, but not limited to CD-ROM and DVD.

Reference is now made to FIGS. 8, 9, 10A and 11 in order to illustrate the method for overriding the error correction codes (ECC) of a specific erroneous or erased symbol on an audio CD.

Figures 7, 8:
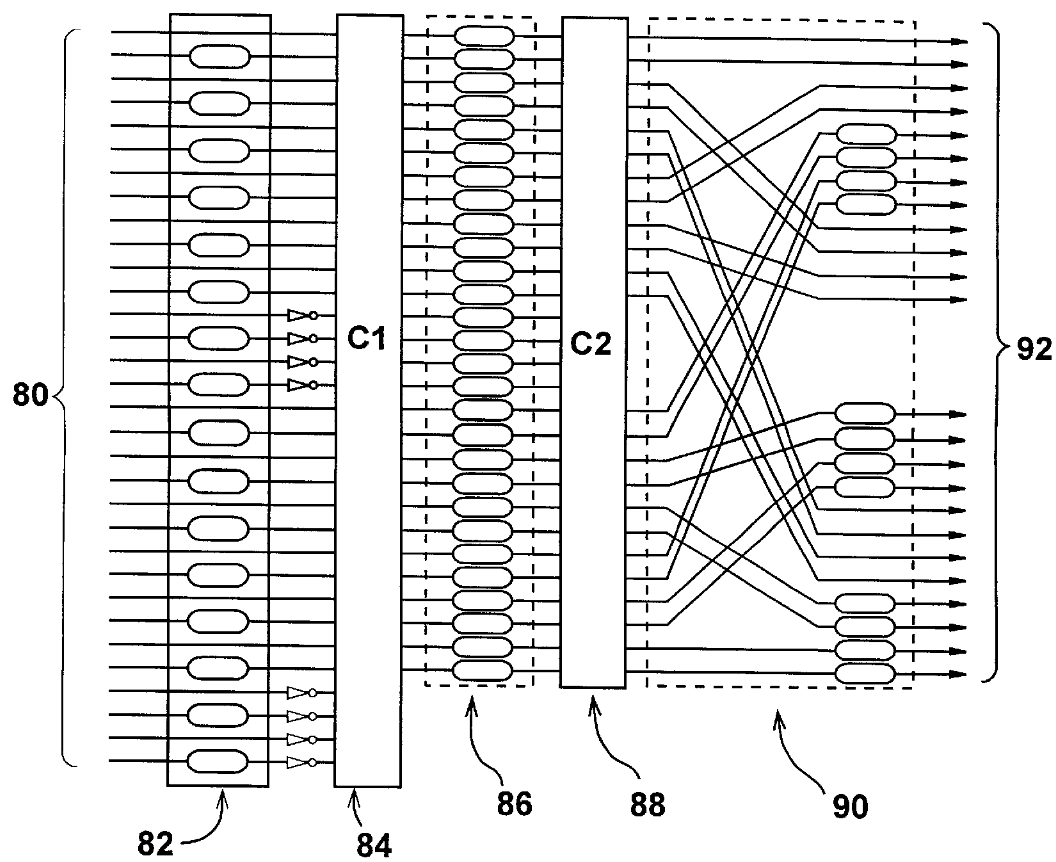
FIG. 7 is a schematic illustration of the symbol reading, error checking, and reordering operations of a prior art digital optical media player.
FIG. 8 is a table showing unused EFM channel bit sequences that are usable for invalid symbol representation.

FIG. 8 illustrates a table of unused 14-bit EFM channel bit sequences (i.e., those sequences are not used to represent any of the possible 256 bit values in the CD system specification). Each code, represented by a row, reference r1, r2, . . . r9, does not correspond to a valid channel bit sequence. For example, the channel bit sequence 01001000000000 (row r7) is invalid since it does not correspond to any byte value or other assigned value.

Figures 9, 11:
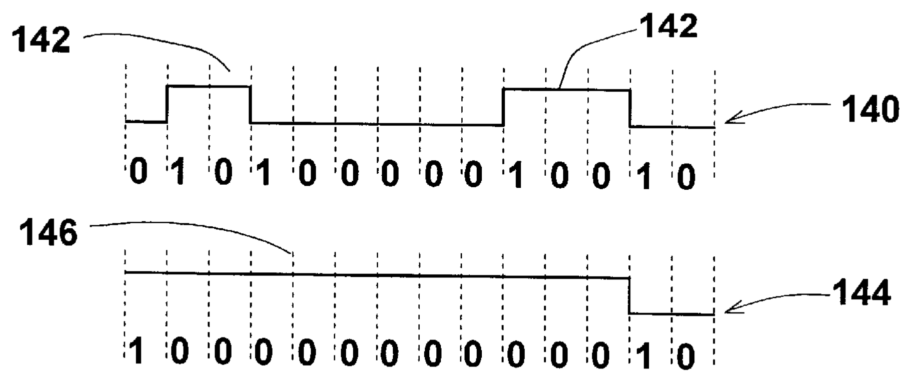
FIG. 9 illustrates some invalid EFM channel bit code sequences with run-length-limited (RLL) errors.
FIG. 11 is a table showing the mapping of data bytes to their corresponding C2 redundancy symbols and related C1 redundancy symbols.

FIG. 9 illustrates two examples of 14-bit channel data sequences, referenced 140 and 144, which violate the EFM run-length-limited (RLL) channel bit encoding rules. Sequence 140 is invalid because it causes two transitions 142 which are less than three (3) clock periods apart. Sequence 144 is invalid because it causes adjacent transitions 146 which are more than eleven (11) clock periods apart.

It will to appreciated by persons knowledgeable in the art that any other invalid EFM sequences which do not conform to the CD standards may be used. It will also be appreciated by persons knowledgeable in the art that other optical media may use other sequence lengths, such as a 16-bit sequence in DVD systems.

FIG. 10A is a table showing the mapping of 24 sequentially input audio CD sector data bytes to their corresponding locations in the frames that are contiguously recorded along the disk data track. FIG. 11 is a table showing the mapping of data bytes to their corresponding C2 redundancy symbols and the related C1 redundancy symbols on both an audio CD and a CD-ROM.

The table of FIG. 10A comprises five columns, referenced 120, 122, 124, 126 and 128. Coloumn 120 lists the numbers of the data bytes in the nth 24-byte sector sub-block to be made ambiguous. Columns 122 and 124 list the frames and symbol numbers, respectively, corresponding to the data bytes in column 120. Columns 126 and 128 list the corresponding C1 error correction symbols in the corresponding frame for specific symbols numbers 29 and 31 (column 126) and symbols numbers 30 and 32 (column 128). Specific symbols numbers 29, 30, 31 and 32 are selected by reference to the international. Electrotechniques Commission (CEI-IEC) standard 908 ("Red Book") specifications, using analysis criteria, known in the art.

The table of FIG. 11 shows the mapping of data bytes to their corresponding C2 redundancy symbols and the related C1 error correcting symbols (i.e., the C1 redundancy symbols used to correct errors in the C2 redundancy symbols). FIG. 11 comprises four columns, referenced 132, 134, 136 and 138. Column 132 lists the C2 byte and symbol number, column 134 lists the C2 symbol and frame numbers, column 136 lists the frame corresponding to symbols numbers 29 and 31, and column 138 lists the frame corresponding to symbols numbers 30 and 32.

It will be appreciated by persons knowledgeable in the art that the specific steps for overriding error correction will depend on the media and the recorder utilized. For example, CD ROM recording involves swapping even-numbered and odd-numbered input data bytes, whereas thee is no such swapping in audio CD recording. FIG. 10A illustrates the mapping of data bytes to their corresponding frame locations and certain C1 redundancy symbols on an audio CD. FIG. 10B is similar to FIG. 10A and illustrates the mapping of data bytes to their corresponding frame locations and certain C1 redundancy symbols on a CD-ROM.

The method of overriding the error correction of a specific symbol is described, for the purposes of example only, with reference to an audio CD (FIGS. 10A and 11). In this example, it is assumed that the CD recorder places the first logical byte in the first byte sector sub-lock, that is with a minor offset of 0.

It with also be appreciated by persons knowledgeable in the art that recorders may "offset" input data by multiples of four bytes and that first logical byte may be located in one of six positions (0, 4, 8, 12, 16, or 20, defined in the Yellow book) in the 24-byte sub-block. These six locations are known as the "minor offset".

Figures 1, 2:
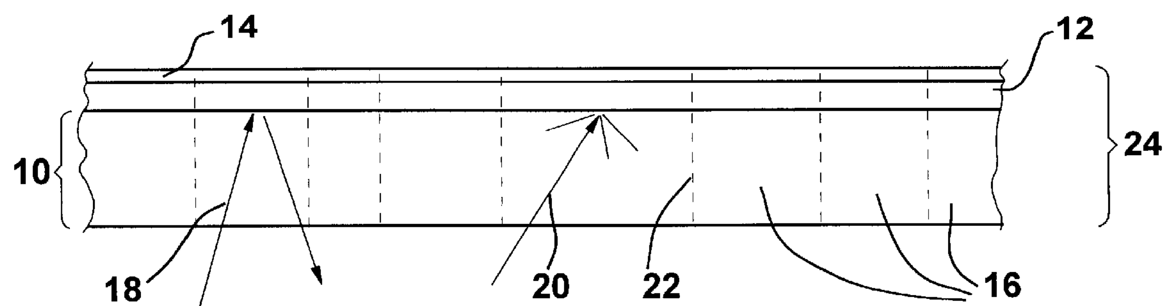
FIG. 1 is a schematic illustration of a data-storage layer of prior art digital optical media.
FIG. 2 is a partial listing of prior art EFM codes used to map 8-bit byte values to constrained 14-bit channel sequences.
Figure 3:
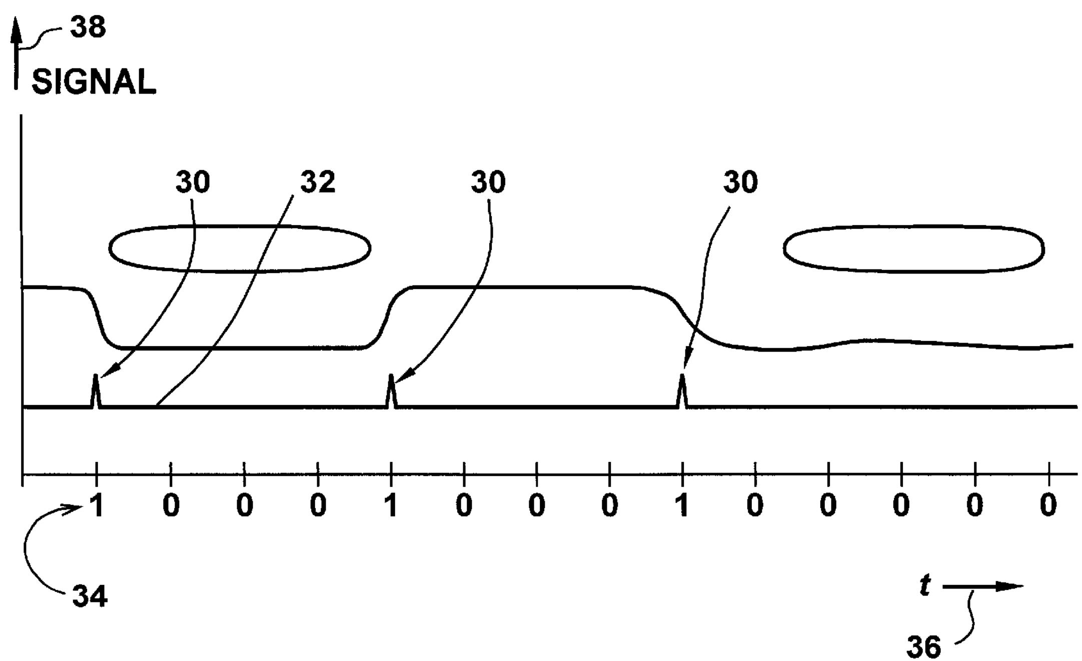
FIG. 3 is a schematic illustration of digital signals detected from prior art digital optical media.
Figure 4:
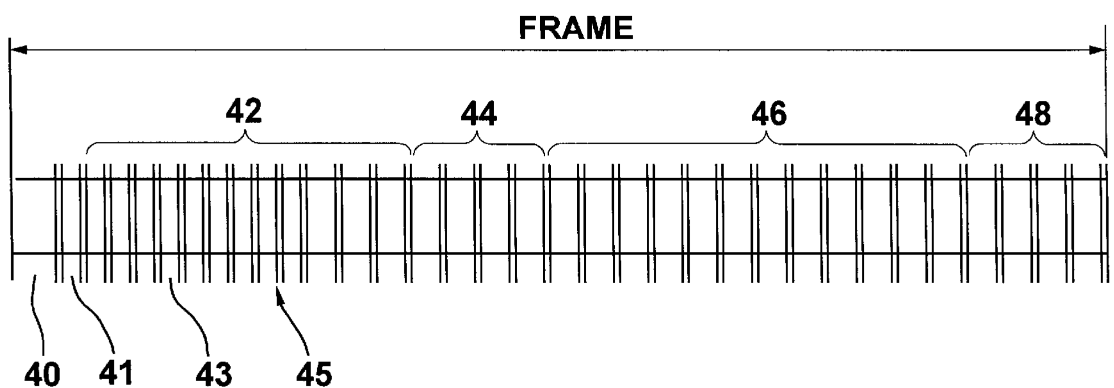
FIG. 4 is a schematic illustration of a frame of data on prior art digital optical media.
Figure 5:
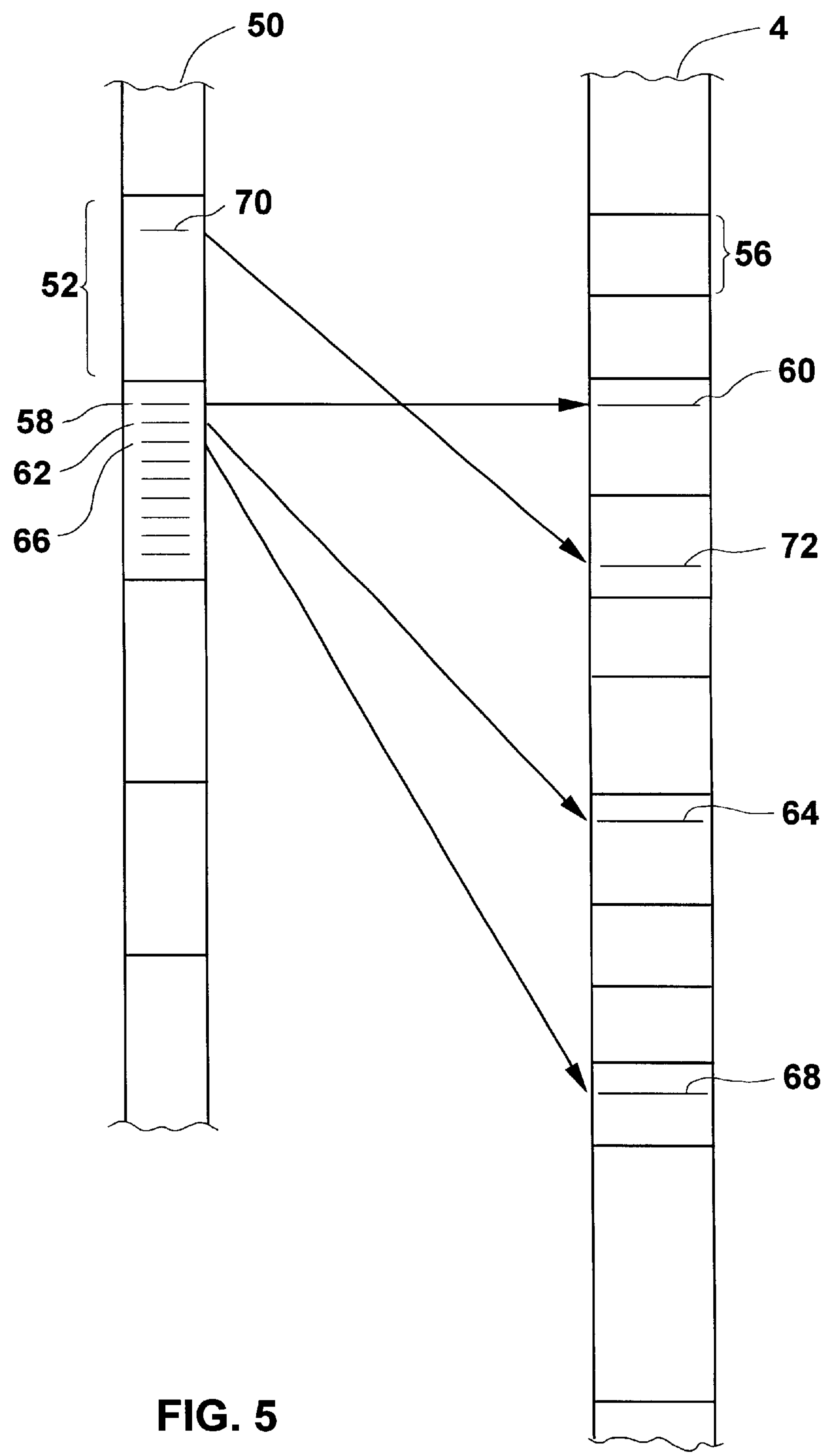
FIG. 5 is a conceptual illustration of data interleaving on prior art digital optical media.
Figure 6:
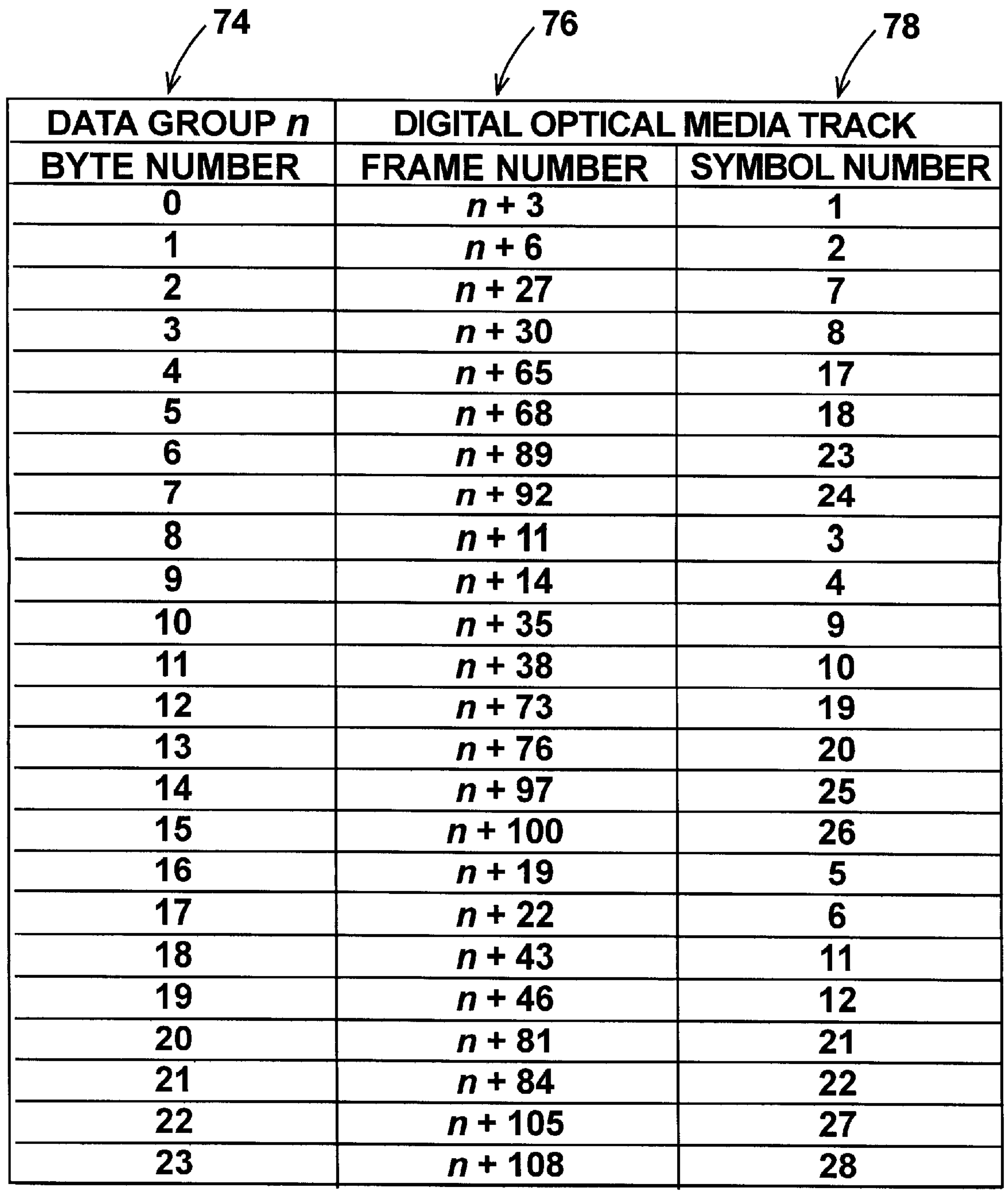
FIG. 6 is a table showing the prior art mapping of input (user) data bytes to frame and symbol locations on a digital optical media track.

The method for overriding the error-correction on an audio CD comprises the following steps:

1. Select a data byte, whose error-correction is to be overridden, Identify the data byte by its byte number, and its data sub-block (n). For example, referring to the table of FIG. 6, select byte 9 from data sub-block 86. That is, n=86.
2. Divide the byte number by 4 and examine the quotient. If the quotient is even, replace n with n+2. For example, byte 9 will yield quotient of 2. Since the quotient is an even umber, replace n=86 with n=88.

3. The "C1" level of error correction is first overridden. Reference is now made to FIG. 10A in order to find the frame number and symbol number of the corresponding symbol whose error-correction is to be overridden, as it is located on the digital optical media. Reference is made to the row for data byte 6. For n=88, column 126 shows that symbols numbered 29 and 31 need to be replaced in frame 101 (n+13) with invalid symbols. Similarly, symbols numbered 30 and 32 need to be replaced in frame 100 (n+12) with invalid symbols.
4. The second "C2" level of error correction is now overridden. Reference to FIG. 11 shows that it is necessary to replace a total of 20 additional symbols with invalid symbols, that is, for each of four C2 byte symbols, five symbols (C2 29, 30, 31 and 32) need to be replaced. For byte 9 of data group 86, corresponding to n=88, reference to column 134 shows that, symbol 13 of frame 137 (n+49), symbol 14 of frame 140 (n+52), symbol 15 of frame 145 (n+57), and symbol 16 of frame 148 (n+60) need to be replaced for a total of four a symbols. With reference to column 136, symbols 29 and 31 of frames 137, 141, 145 and 149 need to be replaced (a total of eight symbols). Similarly, with reference to column 138, symbols 30 and 32 of frames 136, 140, 144, and 148 need to be replaced (a total of eight symbols), making 20 symbols in all.

Data byte 9 of data group 86, will thus have its error correction overridden. This symbol's value will not be adjusted by the reader's error-correction system and will be read as raw data off the digital optical media.

By following the hereinabove described method, other data bytes of other sub-blocks may be similarly overridden.

Similarly, by reference to FIG. 10B, instead of FIG. 10A, the error-correction of a CD-ROM (with a minor offset of 0) can be overridden.

CD-ROM players utilize a third level of correction, known as the Reed-Solomon Product Code (RSPC) error correction. In a further embodiment of the invention, the RSPC error correction process is initially de-activated, (by means of software, for example) while the player is carrying out its ECC functions and only activated later.

It will be appreciated by persons knowledgeable in the art that recorders should be able to carry out the RSPC correction and thus, all RSPC codewords should be traced in order to identify any combinations of target and parity bytes which will not be ultimately correctable by the RSPC decoding.

It will be further appreciated by persons skilled in the art that different digital optical media employ different formats and error-correcting protocols, and the present invention, illustrated above in particular for an audio CD, will adapt itself to different embodiments depending upon the specific choice of the digital optical media.

It will be further appreciated by persons skilled in the art that the above described overriding technique is applicable to other digital data employing error correction. The method has applications in evaluating the efficiency of digital optical media decoder mechanisms, quality control of digital optical media production, and the writing of signatures on digital optical media for copy protection purposes.

It will be appreciated that there are numerous other embodiments which may be applied for the overriding or circumventing of the error correction symbols. The number of codewords which are rendered non-correctable can be varied and is not restricted to a specific member. Further, there are numerous possible processes for effecting the non-correctable codewords. In a non-limiting example, non-decodeable codewords may be effected by the process of causing erroneous target bytes and by causing certain parity bytes to be erroneous when read by CD readers employing different CIRC block decoders. This is especially suitable for players which have marginal playback channel bit clocks and would be incapable of reading a disc having too many invalid EFM sequences.

Since it is essential that decoders work correctly and are capable of recognizing that the ECC codewords are not decodeable, the embodiment utilized may be varied according to the type of decoder and the maximum number of error/erasures it will attempt to correct. For example, three errors per targeted codeword my be created to override the error correction. These errors may use legal (but incorrect) EFM sequences. Alternatively, targeted codewords may affected with five invalid sequences.

It will be further appreciated, by persons skilled in the art, that the location of the target bytes in a sector is not restricted to a particular sector. One non-limiting example of suitable target sector bytes are the parity bytes of the RSPC code used in the CD-ROM. In this case, the changed target bytes will only be visible during a raw read and it will not be possible to determine the location of the errors without decoding the RSPC codewords.

Figure 12:
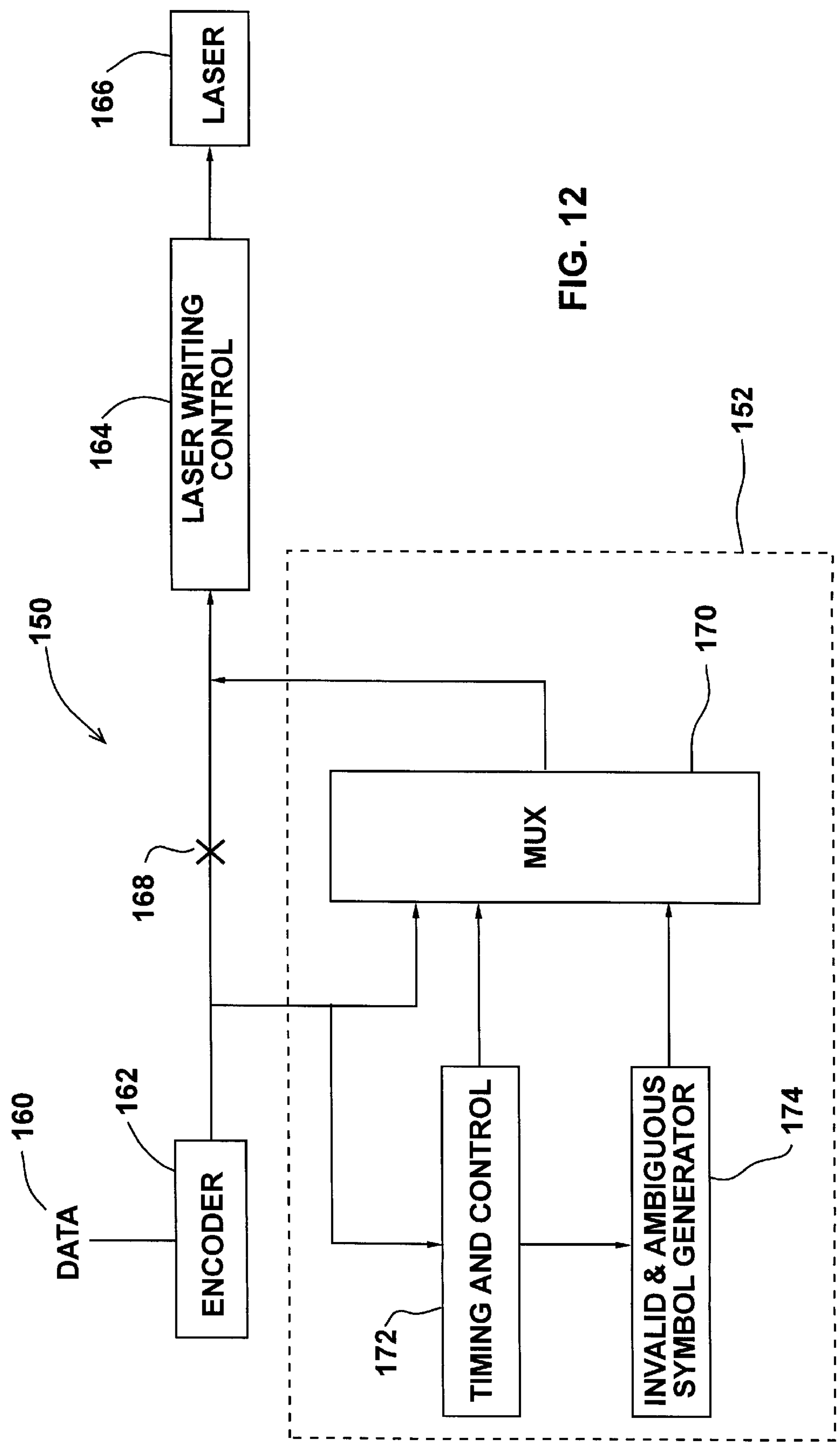
FIG. 12 is a schematic block diagram illustration of a mechanism for recording invalid symbols.

Reference is now made to FIG. 12 which is schematic block diagram illustration of a system, generally designated 150, for recording erroneous symbols, on digital optical media mastering and recording apparatus, in accordance with an embodiment of the invention.

The system 150 comprises on encoder 162, laser writing control 164, and laser 166, standard components known in the art of digital optical media mastering and recording. Serial data 160 is fed into encoder 162, which creates the error-corresponding symbols and performs the data interleaving as needed, before sending the information in the form of channel bits to laser writing control 164. After this point, laser 166 writes the channel bits onto the digital optical media or the master for creating the digital optical media.

The system 150 further comprises additional apparatus, generally designed 152, which comprises a multiplexer 170, a timing and control unit 172 and invalid symbol generator 174. Multiplexer 170 is driven by timing and control unit 172, which selects its input from encoder 162 and invalid symbol generator 174. The additional apparatus 152 is inserted between encoder 162 and laser writing control 164. The direct connection between encoder 162 and laser writing control 164 is broken as shown by symbol X (168).

In this embodiment, most of the channel bit data from encoder 162 is passed along by multiplexer 170, but timing and control unit 172 keeps track of the current frame and symbol that is currently being written, and is programmable to intercept certain symbols selected according to the methods of the present invention. When timing and control unit 172 detects a symbol position that is to be made invalid, it switches the output of multiplexer 170 from the normal channel bit stream from encoder 162, and substitutes an invalid symbol created by invalid symbol generator 174, whose timing it also controls.

Thus, the apparatus 150 creates invalid symbols in predetermined locations on the digital optical media.

It will be appreciated by persons skilled in the art that the present invention is not limited to what has been particularly shown and described above. Rather the scope of the present invention is defined only by the claims which follow.

What is claimed is:

1. A method for overriding error correction on a digital optical medium, the method comprising the steps of:

prior to EFM encoding, determining the error-correction code codeword in which a non-correctable predetermined symbol is to be contained and causing a non-correctable pattern of erroneous symbols to occur in the error-correction code codeword; and following EFM encoding, storing the predetermined symbol and said pattern of erroneous symbols on the digital optical medium.

2. The method according to claim 1, wherein the error-correction code codeword is of a type selected from the group consisting of Reed-Solomon codewords, Cross-Interleave Reed-Solomon Code codewords, and Reed-Solomon Product Code codewords.

3. The method according to claim 1, wherein the digital optical medium is of a type selected from the group consisting of Compact Disc, Compact Disc Read-Only-Memory and Digital Video Disc.

4. The method according to claim 1, wherein the digital optical medium is recorded individually by a computer-controlled optical recorder.

5. The method according to claim 1, wherein said causing a non-correctable pattern of erroneous symbols to occur in the error-correction code codeword code codeword comprises the steps of:

selecting at least one arbitrary symbol from the error-correction code codeword, exclusive of the predetermined symbol; and replacing each of said at least one arbitrary symbol with erroneous symbols.

6. The method according to claim 5, wherein the error-correction code codeword contains redundancy symbols, and wherein at least one of said at least one arbitrary symbol is a redundancy symbol.

7. The method according to claim 5, wherein said erroneous symbols are selected from the group consisting of run length limited errors, erroneous data, invalid channel bit code sequences, and unused channel bit code sequence.

8. The method according to claim 5, wherein the predetermined symbol is to be contained in a plurality of error-correction codewords, the method further comprising the steps of:

prior to EFM encoding performing said determining for at least two of the error-correction codewords;

performing said selecting of said arbitrary symbols for at least two of the error-correction codewords; and performing said replacing for at least two of the error-correction codewords.

9. The method according to claim 1, wherein the digital optical medium is of a type selected from the group consisting of Compact Disc, Compact Disc Read-Only-Memory, and Digital Video Disc.

10. A method for overriding error correction on a digital optical medium, said digital optical medium having a lead-out area with a plurality of sectors, the method comprising the steps of:

prior to EFM encoding, determining an error-correction code codeword in which a non-correctable predetermined symbol is to be contained, and causing a non-correctable pattern of erroneous symbols to occur in the error-correction code codeword; and following EFM encoding, locating the final sector of the lead-out area; and storing at least one non-correctable predetermined symbol in said final sector.

11. The method according to claim 10, wherein the digital optical medium is of a type selected from the group consisting of Compact Disc, Compact Disc Read-Only-Memory, and Digital Video Disc.

12. The method according to claim 10, wherein the digital optical medium is recorded individually by a computer-controlled optical recorder.

13. A digital optical medium, configured for overriding error correction, said digital optical medium comprising:

at least one sector having at least one non-correctable predetermined symbol located therein;

wherein, prior to EFM encoding, said at least one non-correctable predetermined symbol is replaced by one of a non-correctable pattern of erroneous symbols created prior to EFM encoding.

14. The digital optical medium according to claim 13, further comprising a lead-out area having at least one sector, wherein said at least one predetermined symbol is located in said at least one sector of said lead-out area.

15. The digital optical medium according to claim 13, furthermore of a type selected from the group consisting of Compact Disc, Compact Disc Read-Only-Memory, and Digital Video Disc.

16. The digital optical medium according to claim 13, furthermore recorded individually by a computer-controlled optical records.

17. The digital optical medium according to claim 13, further comprising at least one error-correction code codeword, said at least one error-correction code codeword containing said at least one predetermined symbol and said non-correctable pattern of erroneous symbols.

18. The digital optical medium according to claim 17, wherein said at least one error-correction code codeword is of a type selected from the group consisting of Reed-Solomon codewords, Cross-Interleave Reed-Solomon Code codewords, and Reed-Solomon Product Code codewords.

19. The digital optical medium according to claim 17, wherein said non-correctable pattern of erroneous symbols comprises at least one erroneous symbol.

20. The digital optical medium according to claim 19, wherein said at least one erroneous symbol is selected from the group consisting of run length limited errors, erroneous data, invalid channel bit code sequences, and unused channel bit code sequences.

21. A system for overriding error correction on a digital optical medium, said digital optical medium comprising at least one error-correction code codeword, said at least one error-correction code codeword containing said at least one non-correctable predetermined symbol and a non-correctable pattern of erroneous symbols, said system comprising:

a determinator to determine the error-correction code codeword in which said predetermined symbol is to be contained;

an invalid symbol generator for creating erroneous symbols prior to EFM encoding; and a replacing unit to replace said predetermined symbol by one of said erroneous symbols prior to EFM encoding and following EFM encoding, a storage unit to store said predetermined symbol and said erroneous symbols on said digital optical medium.

22. A system according to claim 21 and wherein said determinator comprises an encoder or creating said predetermined symbol.

23. A system according to claim 21 and further comprising:

a multiplexer coupled between said determinator and said laser writing controller;

a laser writing controller coupled to said determinator; and a timing and control unit coupled to said multiplexer.

24. A system according to claim 23 and wherein said timing and control unit keeps track of the current frame and symbol currently being written to on said digital optical medium.

25. A system according to claim 24 and wherein said timing and control unit further comprises intercept means for intercepting said error-correcting symbols for replacement by said erroneous symbols.

26. A system according to claim 21, wherein said erroneous symbols are selected from the group consisting of run length limited errors, erroneous data, invalid channel bit code sequences, and unused channel bit code sequences.

27. A system according to claim 21, wherein the error-correction code codewords is of a type selected from the group consisting of Reed-Solomon codewords, Cross-Interleave Reed-Solomon Code codewords, and Reed-Solomon Product Code codewords.

28. A system according to claim 21, wherein the digital optical medium is of a type selected from the group consisting of Compact Disc, Compact Disc Read-Only-Memory and Digital Video Disc.

* * * * *